US006437596B1

(12) United States Patent
Jenkins et al.

(10) Patent No.: US 6,437,596 B1
(45) Date of Patent: Aug. 20, 2002

(54) INTEGRATED CIRCUITS FOR TESTING A DISPLAY ARRAY

(75) Inventors: Leslie Charles Jenkins, Howes Cave; Frank Robert Libsch, White Plains; Michael Patrick Mastro, Yorktown Heights; Robert Wayne Nywening, Chester; Robert John Polastre, Cold Spring, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/239,325

(22) Filed: Jan. 28, 1999

(51) Int. Cl.[7] .............................................. G01R 31/00
(52) U.S. Cl. ...................................................... 324/770
(58) Field of Search ................................ 324/770, 537, 324/658, 500; 349/139, 49, 54; 345/98, 904, 92

(56) References Cited

U.S. PATENT DOCUMENTS

| | | | | |
|---|---|---|---|---|
| 5,136,622 A | | 8/1992 | Plus | 377/64 |
| 5,148,058 A | | 9/1992 | Stewart | 307/453 |
| 5,166,960 A | | 11/1992 | DaCosta | 377/70 |
| 5,175,446 A | | 12/1992 | Stewart | 307/463 |
| 5,179,345 A | * | 1/1993 | Jenkins et al. | 324/658 |
| 5,222,082 A | | 6/1993 | Plus | 377/79 |
| 5,224,102 A | | 6/1993 | Plus et al. | 371/21 |
| 5,410,583 A | | 4/1995 | Weisbrod et al. | 377/75 |
| 5,465,053 A | * | 11/1995 | Edwards | 324/770 |
| 5,506,516 A | * | 4/1996 | Yamashita et al. | 324/770 |
| 5,539,326 A | * | 7/1996 | Takahashi et al. | 324/770 |
| 5,546,013 A | * | 8/1996 | Ichioka et al. | 324/770 |
| 5,576,730 A | * | 11/1996 | Shimada et al. | 345/98 |
| 5,619,223 A | | 4/1997 | Lee et al. | 340/784 |
| 5,654,970 A | | 8/1997 | DaCosta et al. | 371/22 |

FOREIGN PATENT DOCUMENTS

| | | | |
|---|---|---|---|
| EP | 570115 | A3 | 11/1993 |
| EP | 570115 | A2 | 11/1993 |
| EP | 570115 | B1 | 8/1998 |

OTHER PUBLICATIONS

L. C. Jenkins et al., "Functional testing of TFT/LCD arrays" IBM Journal of Research and Development vol. 36, No. 1, Jan. 1992 pp.59–68.

(List continued on next page.)

*Primary Examiner*—Vinh P. Nguyen
(74) *Attorney, Agent, or Firm*—Marian Underweiser

(57) ABSTRACT

An improved apparatus for testing an array of pixel cells formed on a substrate is provided. Each pixel cell is coupled to at least one gate line of a plurality of gate lines formed on the substrate and at least one data line of a plurality of data lines formed on the substrate. The gate lines and/or data lines are partitioned into a plurality of groups. For each particular group, a first probe pad and select logic is formed on said substrate. The select logic, which is coupled between the first probe pad and the lines of the particular group, selectively couples the first probe pad to the lines of said particular group based upon first control signals supplied to the select logic during a test routine whereby charge is written to, stored, and read from the array of pixel cells. In addition, a second probe pad and hold logic for each particular group may be formed on the substrate. The hold logic, which is coupled between the second probe pad and the lines of the particular group, selectively couples the second probe pad to the lines of the particular group based upon second control signals supplied to the hold logic during the test routine. The apparatus provides a flexible interface between the array under test and the test system, which minimizes the redesign costs when the size and/or resolution of the array under test is varied.

16 Claims, 9 Drawing Sheets

OTHER PUBLICATIONS

S. Kimura et al., "High–Speed Testing of TFT–LCD Array" Society for Information Displays International Symposium Digest of Technical Papers, vol. 23, 1992, pp. 628–631.

R. L. Wisnieff et al., "In–Process Testing of Thin–Film Transistor Arrays" Society for Information Displays International Symposium Digest of Technical Papers, vol. 21, 1990, pp. 190–193.

Arai et al., "Aluminum based gate structure for active matrix liquid crystal displays." IBM Journal of Research and development, vol. 42, No. 3/4, May/Jul. 1998, pp.491–499.*

Fryer, et al., "A Six Mask TFT/LCD Process Using Copper Gate Metallurgy", IBm Research Report, RC 20594, OCt. 1996.

Colgan et al., "A 10.5–in.–diagnol SXGA active–matrix display," IBm Journal of Research and Development, vol 42, No. 3/4, May/Jul. 1998. pp. 427–444.

* cited by examiner

INTEGRATED CIRCUITS FOR TESTING A DISPLAY ARRAY

BACKGROUND OF THE INVENTION

1. Technical Field

The invention relates to electrical testers, and, more specifically, to electrical testing of liquid crystal display (LCD) arrays.

2. Description of the Related Art

An array tester as described in U.S. Pat. No. 5,179,345 and 5,546,013 provides a means for testing the cells of an TFT/LCD display array by coupling test probes to the gate line pads and data line pads that terminate the gate lines and data lines, respectively, of the TFT/LCD array.

Importantly, when the size of the TFT/LCD display array under test is changed, the spacing of the gate lines and/or data lines and the pads terminating thereof change. In order to test such an array, the probe fixture for the gate lines and/or data lines must be redesigned to accommodate for the variation in spacing, which is a costly solution.

In addition, when the resolution of the TFT/LCD display array under test results is changed, the number of gate lines and/or data lines and pads terminating thereof changes. In order to test such an array, the probe fixture for the gate lines and/or data lines must be redesigned to accommodate for the variation in the number of gate lines and/or data lines. Moreover, the gate line drive circuitry and/or the data line drive/sense circuitry and the control routine must be updated to accommodate for the variation in the number of the gate lines and/or data lines. Such design modifications are also very costly.

Thus, there remains a need in the art for an array test system whereby the configuration of the array test system can be changed with minimal costs in order to accommodate variations in the size and/or resolution of the TFT/LCD display arrays under test.

In addition, there remains a need in the art for circuitry integrated onto the substrate that enables reconfiguration of the array test system with minimal costs.

SUMMARY OF THE INVENTION

The problems stated above and the related problems of the prior art are solved with the principles of the present invention, integrated circuits for testing a display array, which comprises an array of pixel cells formed on a substrate. Each pixel cell is coupled to at least one gate line of a plurality of gate lines formed on the substrate and at least one data line of a plurality of data lines formed on the substrate. The gate lines and/or data lines are partitioned into a plurality of groups. For each particular group, a first probe pad and select logic is formed on said substrate. The select logic, which is coupled between the first probe pad and the lines of the particular group, selectively couples the first probe pad to the lines of said particular group based upon first control signals supplied to the select logic during a test routine whereby charge is written to, stored, and read from the array of pixel cells. In addition, a second probe pad and hold logic for each particular group may be formed on the substrate. The hold logic, which is coupled between the second probe pad and the lines of the particular group, selectively couples the second probe pad to the lines of the particular group based upon second control signals supplied to the hold logic during the test routine. The apparatus provides a flexible interface between the array under test and the test system, which minimizes the redesign costs when the size and/or resolution of the array under test is varied.

DETAILED DESCRIPTION OF THE INVENTION

Figure 1A:
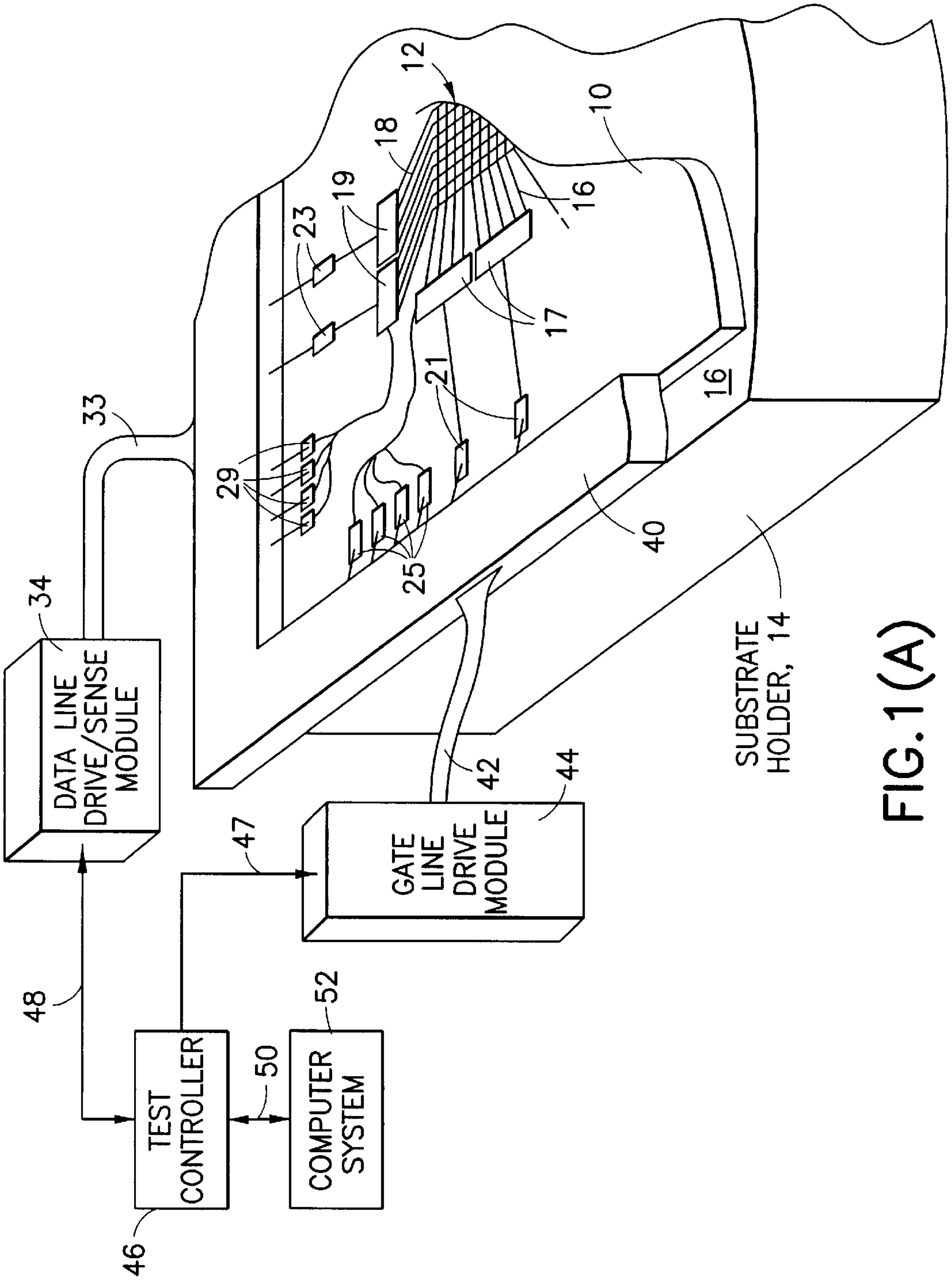
FIG. 1(A) is a pictorial illustration of the display array test system of the present invention.
Figure 1B:
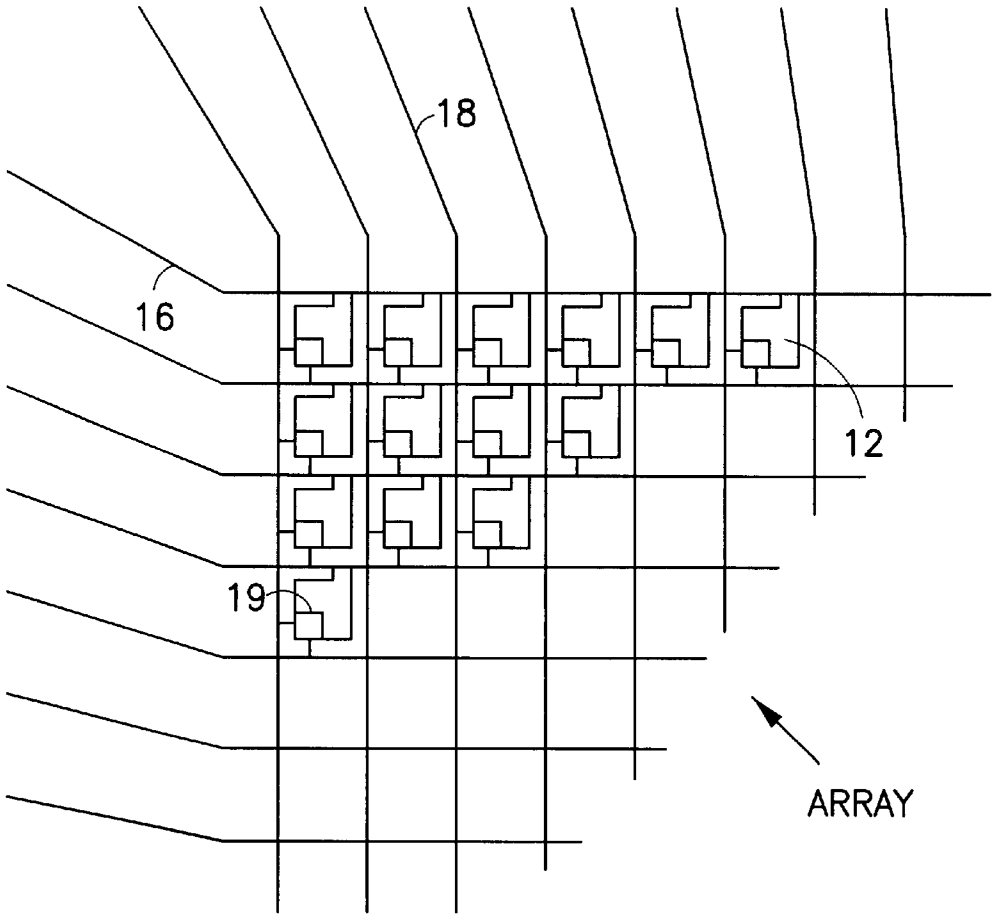
FIG. 1(B) is a pictorial illustration of an exemplary array of pixel cells and the gate lines and data lines connected thereto.

Referring to FIG. 1(A), a substrate 10 having formed thereon an array of TFT/LC pixel cells 12 is supported on a substrate holder 14. Substrate 10 has a number of gate lines 16 and data lines 18 formed thereon that are electrically coupled to the TFTs (not shown) of the cells to drive the array of cells 12. FIG. 1(B) illustrates the array of cells 12 formed on the substrate 10. Each pixel cell 12 includes a TFT 19 coupled to a gate line 16 and data line 18.

The basic routine for testing the array is as follows: biasing the gate line 16 and data line 18 connected to a cell 12 such that the TFT of the cell 12 is in a conductive (ON) state and charge is written to the cell 12, storing the charge in the cell 12 by biasing the gate line 16 and data line 18 connected to the cell 12 such that the TFT of the cell 12 is in a nonconductive (OFF) state, and reading the charge stored in the cell 12. Reading the charge stored in a cell 12 is accomplished by electrically coupling sense circuitry to the data line 18 connected to the cell 12 and biasing the gate line 16 connected to the cell 12 such that TFT 19 of the cell is in a conductive (ON) state, thereby allowing the charge stored in the cell 12 to be transferred to sense circuitry. The charge transferred to the sense circuitry is measured, and a waveform is generated based upon the transferred charge. The waveform for one or more cells is analyzed to identify defective cells (i.e., open gate or data line, short to adjacent line, resistive crossing, etc.).

According to the present invention, the gate lines 16 of the array are partitioned into groups (for example, partitioned into groups of 4 gate lines as shown in FIG. 1). A probe pad 21 is provided for each group of gate lines. Gate line select/hold circuitry 17 is integrally formed on the substrate 10 coupled between the probe pad 21 and the group of gate lines, and provides select logic for selectively coupling one or more gate lines for the group to the probe pad 21. Preferably the select logic for the group is controlled by control signals supplied to the select logic via gate select control pads 25 (for example, the 4 gate select control pads 25 shown). Note that for the sake of illustration, the gate select control pads 25 for the second group of gate lines is not shown in FIG. 1. In addition, a second probe pad 27 (not shown in FIG. 1) is preferably provided for the group of gate lines, and the gate line select/hold circuitry 17 for the group includes hold logic for selectively coupling one or more of the gate lines for the group to the second probe pad 27. Preferably the hold logic for the group is controlled by control signals supplied to the hold logic via gate hold control pads 28 (not shown). A more detailed description of the gate line select/hold circuitry 17 and associated control is described below with respect to FIG. 2. Preferably, the second probe pad 27 is shared by more than one group of gate lines.

In addition, the data lines 18 of the array are preferably partitioned into groups (for example, partitioned into groups of 4 data lines as shown in FIG. 1). A probe pad 23 is provided for each group of data lines. Data line select/hold circuitry 19 is integrally formed on the substrate 10 coupled between the probe pad 23 and the group of data lines, and provides select logic for selectively coupling one or more data lines for the group to the probe pad 23. Preferably the select logic for the group is controlled by control signals supplied to the select logic via data select control pads 29 (for example, the 4 data select control pads 29 shown). Note that for the sake of illustration the data select control pads 29 for the second group of data lines is not shown in FIG. 1. In addition, a second probe pad 31 (not shown) is preferably provided for the group of data lines, and the data line select/hold circuitry 19 for the group includes hold logic for selectively coupling one or more of the data lines for the group to the second probe pad 31. Preferably the hold logic for the group is controlled by control signals supplied to the hold logic via data hold control pads 32 (not shown). A more detailed description of the data line select/hold circuitry 19 is described below with respect to FIG. 3. Preferably, the second probe pad 31 is shared by more than one group of data lines.

Figure 2:
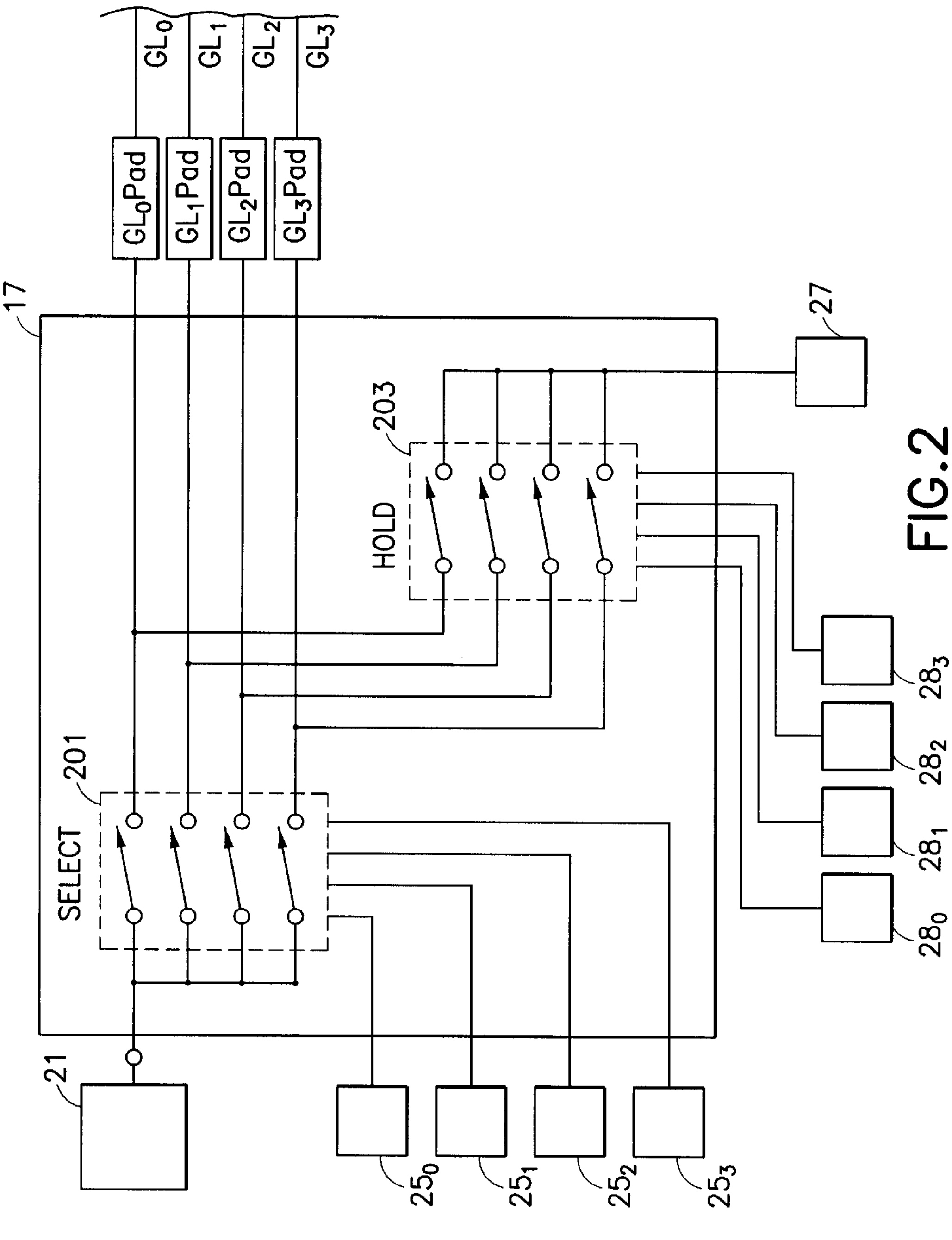
FIG. 2 is a functional block diagram illustrating the gate line select/hold circuitry of FIG. 1(A) for a group of gate lines.

Referring to FIG. 2, the gate line select/hold circuitry 17 is coupled between a group of gate lines 16 (for example the 4 gate lines $GL_0$, $GL_1$, $GL_2$ and $GL_3$ as shown) and a probe pad 21 for the group. The gate line select/hold circuitry 17 for the group includes select logic 201 that selectively couples one or more gate lines for the group to the probe pad 21 in response control signals supplied via gate select control pads 25. For example, four (4) gate select control pads 25$_0$, 25$_1$, 25$_2$, 25$_3$ may supply four binary control signals to control the select logic 201 for the group as follows:

| Control Signals | | | | Gate Line Coupled to Probe Pad 21 for the Group | | | | |
|---|---|---|---|---|---|---|---|---|
| $25_0$ | $25_1$ | $25_2$ | $25_3$ | $GL_0$ | $GL_1$ | $GL_2$ | $GL_3$ | Mode |
| 0 | 0 | 0 | 0 | N | N | N | N | A and B |
| 0 | 0 | 0 | 1 | N | N | N | Y | |
| 0 | 0 | 1 | 0 | N | N | Y | N | A |
| 0 | 1 | 0 | 0 | N | Y | N | N | |
| 1 | 0 | 0 | 0 | Y | N | N | N | |
| 0 | 0 | 1 | 1 | N | N | Y | Y | |
| 0 | 1 | 0 | 1 | N | Y | N | Y | |
| 0 | 1 | 1 | 0 | N | Y | Y | N | |
| 0 | 1 | 1 | 1 | N | Y | Y | Y | |
| 1 | 0 | 0 | 1 | Y | N | N | Y | |
| 1 | 0 | 1 | 0 | Y | N | Y | N | |
| 1 | 0 | 1 | 1 | Y | N | Y | Y | B |
| 1 | 1 | 0 | 0 | Y | Y | N | N | |
| 1 | 1 | 0 | 1 | Y | Y | N | Y | |
| 1 | 1 | 1 | 0 | Y | Y | Y | N | |
| 1 | 1 | 1 | 1 | Y | Y | Y | Y | |

-continued

Note that the select logic 201 may operate in one of two modes A and B. In mode A, a single gate line is coupled to the probe pad 21 for the group of gate lines. In mode B, more than one gate line is coupled to the probe pad 21 for the group of gate lines. Mode A is preferably used for addressing the cells of the array connected to one gate line of the group. Mode B is preferably used for addressing the cells connected to multiple gate lines of the group.

It should be noted that gate select control pads (for example, the gate select control pads 25$_0$, 25$_1$, 25$_2$, 25$_3$) may supply control signals to the select logic 201 for more than one group of gate lines, in which case the addressing function of the select logic 201 for the more than one group of gate lines is replicated. By applying an activation signal to the probe pad 21 for only one group, this configuration may be used to selectively address the cells connected to the gate lines for the one group. Alternatively, an activation signal may be applied to the probe pad 21 for more then one group, thereby addressing multiple cells that are connected to gate lines belonging to different groups. This configuration may be useful in writing charge to and reading charge from multiple cells connecting to gate lines belonging to different groups yet share a common data line.

In addition, a second probe pad 27 is preferably provided for each group of gate lines, and one select/hold circuitry 17 for the group includes hold logic 203 that selectively couples one or more gate lines for the group to the second probe pad 27 in response control signals supplied gate hold control pads 28. For example, four (4) gate hold control pads 28$_0$, 28$_1$, 28$_2$, 28$_3$ may supply four binary control signals to control the hold logic 203 for the group as follows:

| Control Signals | | | | Gate Line Coupled to Probe Pad 27 for the Group | | | | |
|---|---|---|---|---|---|---|---|---|
| $28_0$ | $28_1$ | $28_2$ | $28_3$ | $GL_0$ | $GL_1$ | $GL_2$ | $GL_3$ | Mode |
| 0 | 0 | 0 | 0 | N | N | N | N | A and B |
| 0 | 0 | 0 | 1 | N | N | N | Y | |
| 0 | 0 | 1 | 0 | N | N | Y | N | A |
| 0 | 1 | 0 | 0 | N | Y | N | N | |
| 1 | 0 | 0 | 0 | Y | N | N | N | |
| 0 | 0 | 1 | 1 | N | N | Y | Y | |
| 0 | 1 | 0 | 1 | N | Y | N | Y | |
| 0 | 1 | 1 | 0 | N | Y | Y | N | |
| 0 | 1 | 1 | 1 | N | Y | Y | Y | |
| 1 | 0 | 0 | 1 | Y | N | N | Y | |
| 1 | 0 | 1 | 0 | Y | N | Y | N | |
| 1 | 0 | 1 | 1 | Y | N | Y | Y | B |

-continued

| Control Signals | | | | Gate Line Coupled to Probe Pad 27 for the Group | | | | |
|---|---|---|---|---|---|---|---|---|
| $28_0$ | $28_1$ | $28_2$ | $28_3$ | $GL_0$ | $GL_1$ | $GL_2$ | $GL_3$ | Mode |
| 1 | 1 | 0 | 0 | Y | Y | N | N | |
| 1 | 1 | 0 | 1 | Y | Y | N | Y | |
| 1 | 1 | 1 | 0 | Y | Y | Y | N | |
| 1 | 1 | 1 | 1 | Y | Y | Y | Y | |

Note that the hold logic 203 may operate in one of two modes A and B. In mode A, a single gate line is coupled to the probe pad 27 for the group of gate lines. In mode B, more than one gate line is coupled to the probe pad 27 for the group of gate lines. Mode A is preferably used for applying a predetermined potential (for example, a test potential as described below in more detail) to a single gate line of the group. Mode B is preferably used for used for applying a predetermined potential (for example, a ground potential as described below in more detail) to multiple gate lines of the group.

It should be noted that gate hold control pads (for example, the gate hold control pads 28$_0$, 28$_1$, 28$_2$, 28$_3$) may supply control signals to the hold logic 203 for more than one group of gate lines, in which case the function of the hold logic 203 for the more than one group of gate lines is replicated.

It should be understood by those skilled in the art that when substrate 10 is assembled with a second substrate, spacers, liquid crystal material and a seal, the following components may not be present: the gate line select/hold circuitry 17 for the group, and pads 21, 25, 27 and 28 for the group. In other words, substrate 10 may be cut to remove these elements. In this case, the substrate 10 includes gate line pads that interface to gate line driver circuitry for driving the gates lines of the array during normal operation of the display system. In an alternate embodiment, the probe pad 21, select logic 201 and control pads 25 for the group may interface to the gate line driver circuitry and be integrated into the driving scheme for the array during normal operation.

Figure 3:
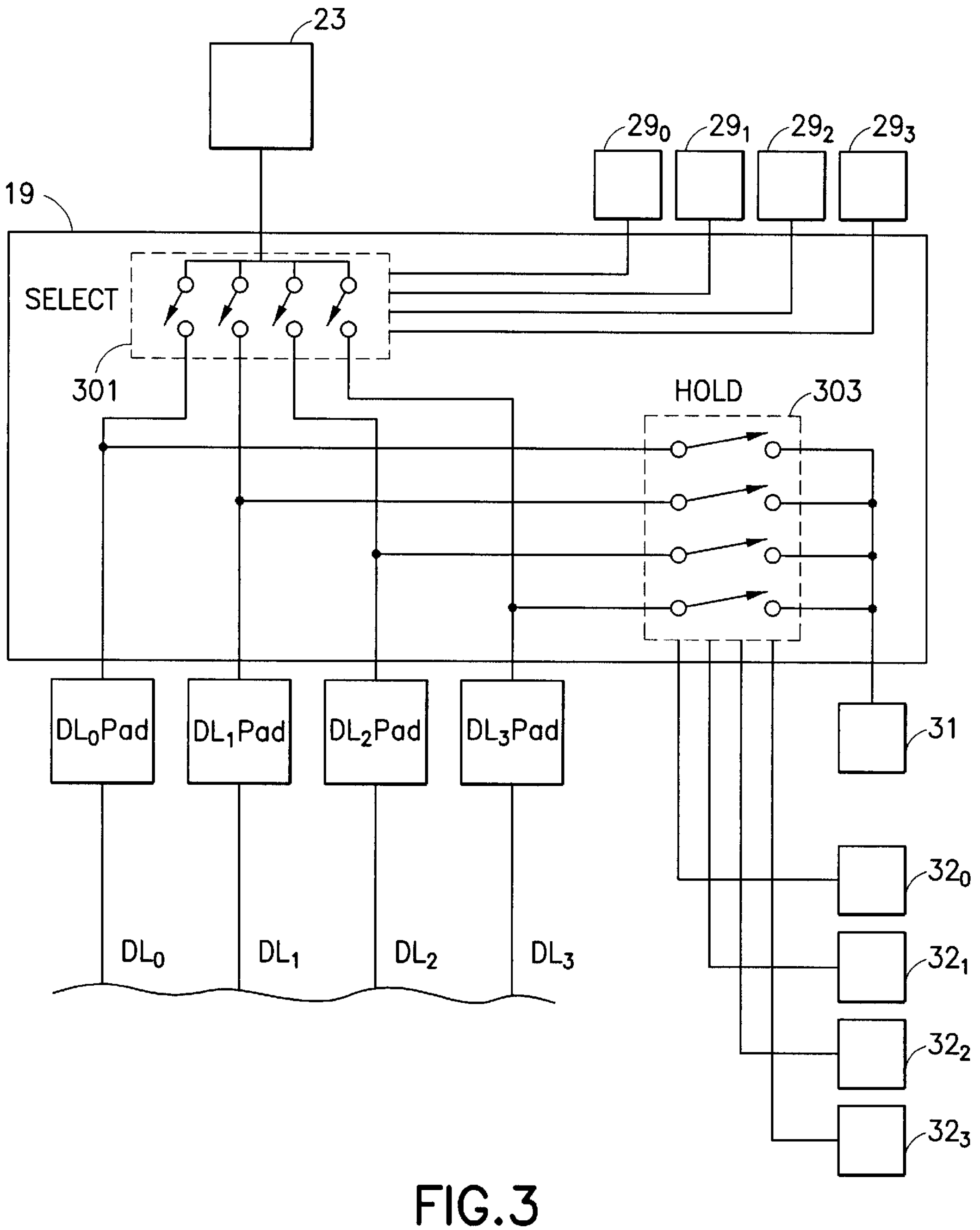
FIG. 3 is a functional block diagram illustrating the data line select/hold circuitry of FIG. 1(A) for a group of data lines.

Referring to FIG. 3, the data line select/hold circuitry 19 is coupled between a group of data lines 18 (for example the 4 data lines $DL_0$, $DL_1$, $DL_2$ and $DL_3$ as shown) and a probe pad 23 for the group. The data line select/hold circuitry 19 for the group includes select logic 301 that selectively couples one or more of the data lines for the group to the probe pad 23 in response control signals supplied via data select control pads 29. For example, four (4) data select control pads 29$_0$, 29$_1$, 29$_2$, 29$_3$ may supply four binary control signals to control the select logic 301 for the group as follows:

| Control Signals | | | | Data Line Coupled to Probe Pad 23 for the Group | | | | |
|---|---|---|---|---|---|---|---|---|
| $29_0$ | $29_1$ | $29_2$ | $29_3$ | $DL_0$ | $DL_1$ | $DL_2$ | $DL_3$ | Mode |
| 0 | 0 | 0 | 0 | N | N | N | N | A and B |
| 0 | 0 | 0 | 1 | N | N | N | Y | |
| 0 | 0 | 1 | 0 | N | N | Y | N | A |
| 0 | 1 | 0 | 0 | N | Y | N | N | |
| 1 | 0 | 0 | 0 | Y | N | N | N | |
| 0 | 0 | 1 | 1 | N | N | Y | Y | |
| 0 | 1 | 0 | 1 | N | Y | N | Y | |

-continued

| Control Signals | | | | Data Line Coupled to Probe Pad 23 for the Group | | | | |
|---|---|---|---|---|---|---|---|---|
| $29_0$ | $29_1$ | $29_2$ | $29_3$ | $DL_0$ | $DL_1$ | $DL_2$ | $DL_3$ | Mode |
| 0 | 1 | 1 | 0 | N | Y | Y | N | |
| 0 | 1 | 1 | 1 | N | Y | Y | Y | |
| 1 | 0 | 0 | 1 | Y | N | N | Y | |
| 1 | 0 | 1 | 0 | Y | N | Y | N | |
| 1 | 0 | 1 | 1 | Y | N | Y | Y | B |
| 1 | 1 | 0 | 0 | Y | Y | N | N | |
| 1 | 1 | 0 | 1 | Y | Y | N | Y | |
| 1 | 1 | 1 | 0 | Y | Y | Y | N | |
| 1 | 1 | 1 | 1 | Y | Y | Y | Y | |

Note that the select logic 301 may operate in one of two modes A and B. In mode A, a single data line is coupled to the probe pad 23 for the group of data lines. In mode B, more than one data line is coupled to the probe pad 23 for the group of data lines. Mode A is preferably used for writing charge to (and reading charge from) cells of the array connected to one data line of the group in single address cycle. Mode B is preferably used for writing charge to (and reading charge from) cells of the array connected to multiple data lines of the group in a single address cycle.

It should be noted that data select control pads (for example, the data select control pads 29$_0$, 29$_1$, 29$_2$, 29$_3$) may supply control signals to the select logic 301 for more than one group of data lines, in which case the function of the select logic 301 for the more than one group of data lines is replicated. Charge may be applied to and/or read from a probe pad 23 for only one group of data lines. This configuration may be used to write charge and/or read charge from the cells connected to the data lines for the one group in an address cycle. Alternatively, charge may be applied to and/or read from the probe pad 23 for more than one group. This configuration may be used to write charge to and/or read charge from multiple cells connected to data lines for more than one group in an address cycle.

It should be noted that mode A of the select logic 301 may be used in conjunction with mode B of the select logic 201 of the gate line select/hold circuitry 17 to write charge to (and read charge from) more than one cell of the array in an address cycle. In addition, mode B of the select logic 301 may be used in conjunction with modes A and B of the select logic 201 of the gate line select/hold circuitry 17 to write charge to (and read charge from) more than one cell of the array in an address cycle. When charge from more than one cell is read from a single data line (Mode A of the select logic 301) or more than one data line (Mode B of the select logic 301), the analysis of the waveform for the cells is adjusted appropriately. In the event that a defect is identified in the cells, the test routine may sequence through the potentially defective cells individually (Mode A of select logic 201 and mode A of select logic 301) to identify the defective cell(s).

In addition, a second probe pad 31 is preferably provided for the group of data lines, and the data line select/hold circuitry 19 for the group includes hold logic 301 that selectively couples one or more data lines for the group to the second probe pad 31 in response control signals supplied via data hold control pads 32. For example, four (4) data hold control pads 32$_0$, 32$_1$, 32$_2$, 32$_3$ may supply four binary control signals to control the hold logic 303 for the group as follows:

| Control Signals | | | | Data Line Coupled to Probe Pad 31 for the Group | | | | |
|---|---|---|---|---|---|---|---|---|
| $32_0$ | $32_1$ | $32_2$ | $32_3$ | $DL_0$ | $DL_1$ | $DL_2$ | $DL_3$ | Mode |
| 0 | 0 | 0 | 0 | N | N | N | N | A and B |
| 0 | 0 | 0 | 1 | N | N | N | Y | |
| 0 | 0 | 1 | 0 | N | N | Y | N | A |
| 0 | 1 | 0 | 0 | N | Y | N | N | |
| 1 | 0 | 0 | 0 | Y | N | N | N | |
| 0 | 0 | 1 | 1 | N | N | Y | Y | |
| 0 | 1 | 0 | 1 | N | Y | N | Y | |
| 0 | 1 | 1 | 0 | N | Y | Y | N | |
| 0 | 1 | 1 | 1 | N | Y | Y | Y | |
| 1 | 0 | 0 | 1 | Y | N | N | Y | |
| 1 | 0 | 1 | 0 | Y | N | Y | N | |
| 1 | 0 | 1 | 1 | Y | N | Y | Y | B |
| 1 | 1 | 0 | 0 | Y | Y | N | N | |
| 1 | 1 | 0 | 1 | Y | Y | N | Y | |
| 1 | 1 | 1 | 0 | Y | Y | Y | N | |
| 1 | 1 | 1 | 1 | Y | Y | Y | Y | |

Note that the hold logic 303 may operate in one of two modes A and B. In mode A, a single data line is coupled to the probe pad 31 for the group of data lines. In mode B, more than one data line is coupled to the probe pad 31 for the group of data lines. Mode A is preferably used for applying a predetermined potential (for example, a test potential, as described below in more detail) to a single data lines of the group. Mode B is preferably used for used for applying a predetermined potential (for example, a ground potential, as described below in more detail) to multiple data lines of the group.

It should be noted that data hold control pads (for example, the data hold control pads $\mathbf{32}_0$, $\mathbf{32}_1$, $\mathbf{32}_2$, $\mathbf{32}_2$) may supply control signals to the hold logic 303 for more than one group of data lines, in which case the function of the hold logic 303 for the more than one group of data lines is replicated.

It should be understood by those skilled in the art that when substrate 10 is assembled with a second substrate, spacers, liquid crystal material and a seal, the following components may not be present: the data line select/hold circuitry 19 for the group, and pads 23, 29, 31 and 32 for the group. In other words, substrate 10 may be cut to remove these elements. In this case, the substrate 10 includes data line pads that interface to data line driver circuitry for driving the data lines of the array during normal operation of the display system. In an alternate embodiment, the probe pad 23, select logic 301 and control pads 29 for the group may interface to the data line driver circuitry and be integrated into the driving scheme for the array during normal operation.

Importantly, when performing the test routine for the cells of the array, the gate line select/hold circuitry 17 for each group of gate lines is controlled to apply activation signals to the group of gate lines associated therewith and the data line select/hold circuitry 19 for each group of data lines is controlled, such that charge is written and read from the cells of the array via the data lines associated therewith. An example of the control of the gate line select/hold circuitry 17 and data line select/hold circuitry 19 in performing the test routine for the cells of the array is illustrated in FIGS. 4 and 5.

Figure 4A:
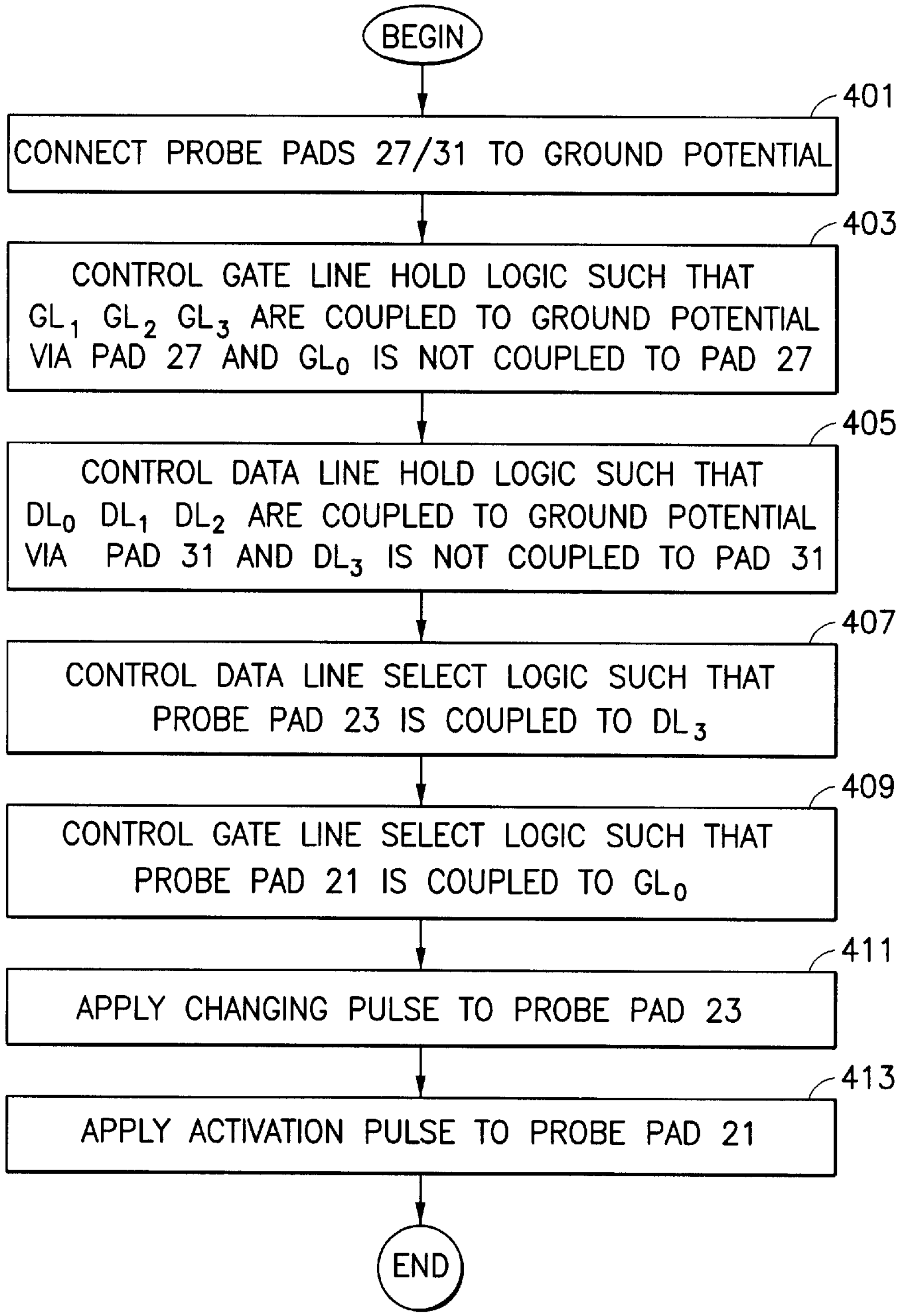
FIG. 4(A) is a flow chart illustrating the control of the gate line select/hold circuitry and data line select/hold circuitry of FIGS. 2 and 3 in writing charge to a cell connected to an exemplary gate line/data line pair ($GL_0$, $DL_3$) in an addressing cycle.
Figure 4B:
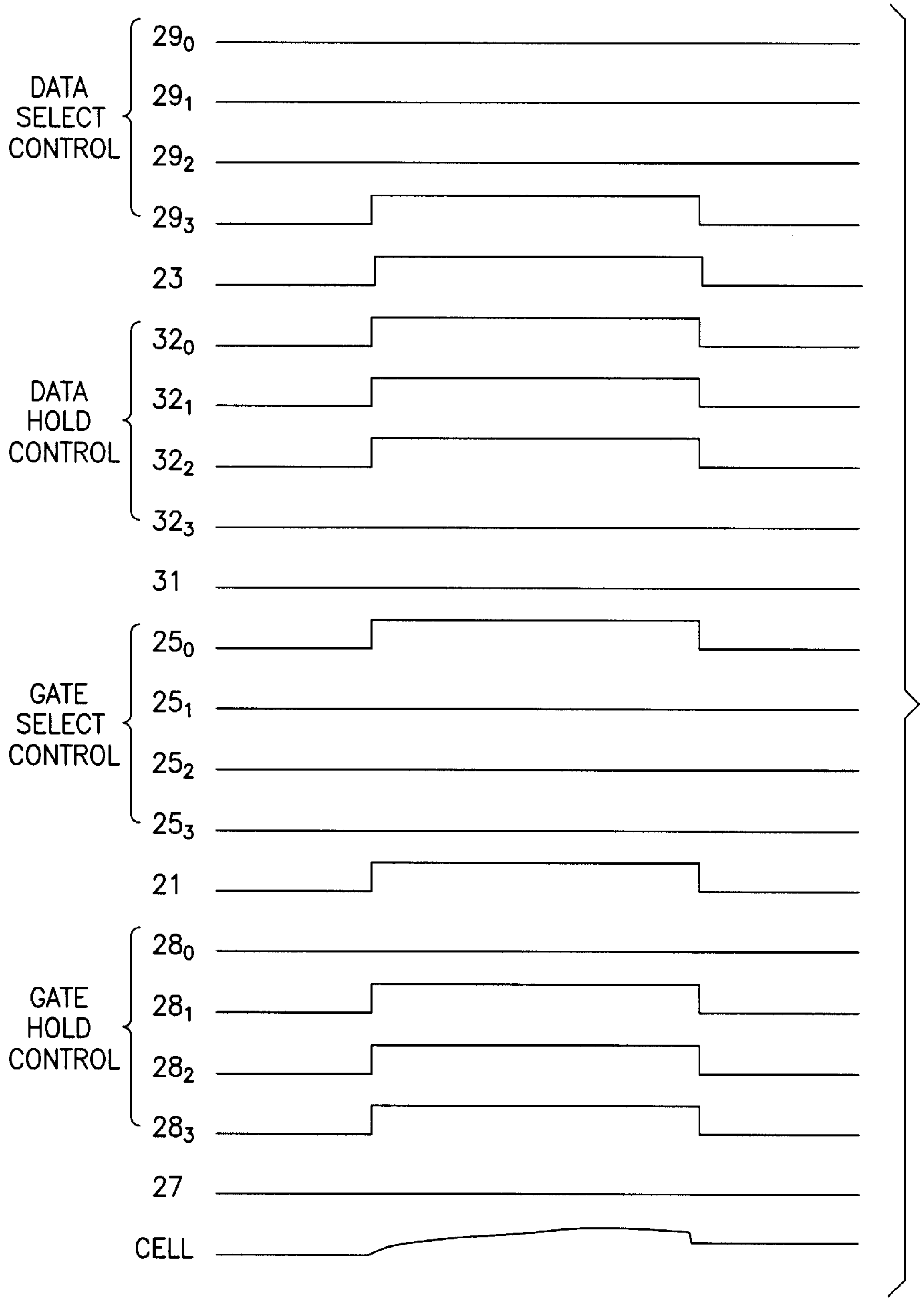
FIG. 4(B) is a timing diagram of an exemplary implementation of the control of FIG. 4(A).

FIGS. 4(A) and (B) illustrate the control of the gate line select/hold circuitry 17 and data line select/hold circuitry 19 in writing charge to a cell connected to an exemplary gate line/data line pair ($GL_0$, $DL_3$) belonging to the group of gate lines and group of data lines illustrated in FIGS. 2 and 3. FIG. 4(A) is a flow chart illustrating the control of the gate line select/hold circuitry 17 and data line select/hold circuitry 19 in writing charge to a cell connected to an exemplary gate line/data line pair ($GL_0$, $DL_3$) in an addressing cycle; and FIG. 4(B) is a timing diagram of an exemplary implementation of the control of FIG. 4(A). Similar operations are performed in writing charge to multiple cells of the array in an address cycle.

Referring to FIG. 4(A), in step 401, probe pad 27 and probe pad 31 are connected to ground potential. In step 403, hold logic 203 of the gate line select/hold circuitry 17 is controlled (via control signals applied to gate hold control pads 28) such that the other gate lines $GL_1$, $GL_{2,\ GL3}$ of the group are coupled to ground potential via probe pad 27 and the gate line $GL_0$ is not coupled to the probe pad 27. In step 405, hold logic 303 of the data line select/hold circuitry 19 is controlled (via control signals applied to data hold control pad(s) 32) such that the other data lines $DL_0$, $DL_1$, $DL_2$ of the group are coupled to ground potential via probe pad 31 and the data line $DL_3$ is not coupled to the probe pad 31. In step 407, select logic 301 of the data line select/hold circuitry 19 is controlled (via control signals applied to data select control pads 29) such that probe pad 23 is coupled to the data line $DL_3$ of the cell. In step 409, select logic 201 of the gate line select/hold circuitry 17 is controlled (via control signals applied to gate select control pads 25) such probe pad 21 is coupled to the gate line $GL_0$ of the cell. In step 411, a charging pulse is applied to the pad 23 (and to data line $DL_3$ coupled thereto in step 407). In step 413, concurrent with the application of the charging pulse in step 411, an activation pulse is applied to pad 21 (and to gate line $GL_0$ coupled thereto in step 409). The activation pulse on gate line $GL_0$ turns the TFT of the cell into a conductive state (ON), thereby providing a conduction path for the charging pulse applied to data line $DL_3$ to charge the cell.

Note that, in step 403, the hold logic 203 is controlled such that those gate lines not connected to a cell that is to be charged) are coupled to ground potential, and, in step 405, hold logic 303 is controlled such that those data lines not connected to a cell that is to be charged are also coupled to ground potential. These operations ground the inactive gate lines to ground, which minimizes the capacitive coupling between the inactive gate lines and the active (i.e., lines to which the charging pulse is applied) data lines.

Figure 5A:
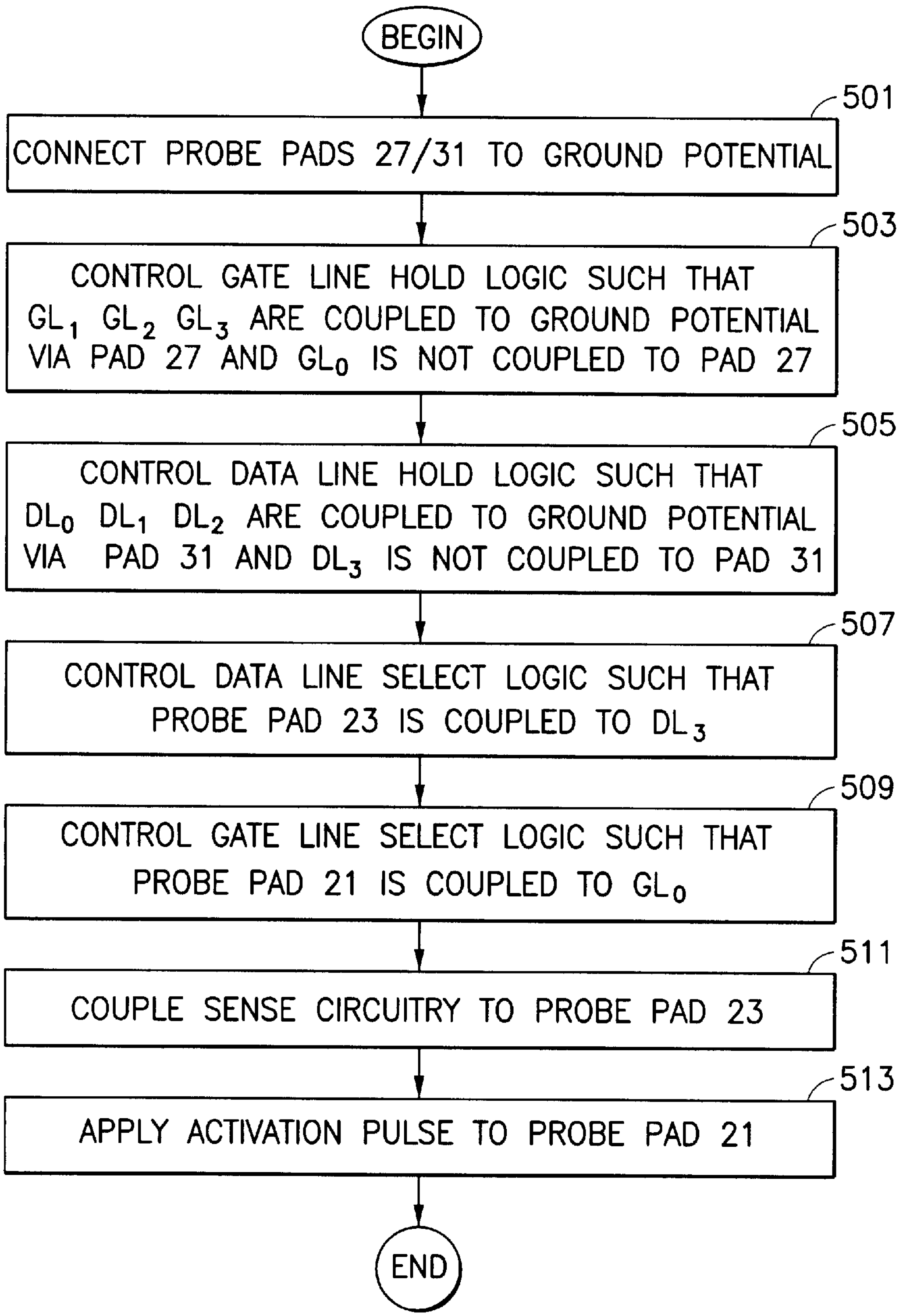
FIG. 5(A) is a flow chart illustrating the control of the gate line select/hold circuitry and data line select/hold circuitry of FIGS. 2 and 3 in reading charge from a cell connected to an exemplary gate line/data line pair ($GL_0$, $DL_3$) in an address cycle.
Figure 5B:
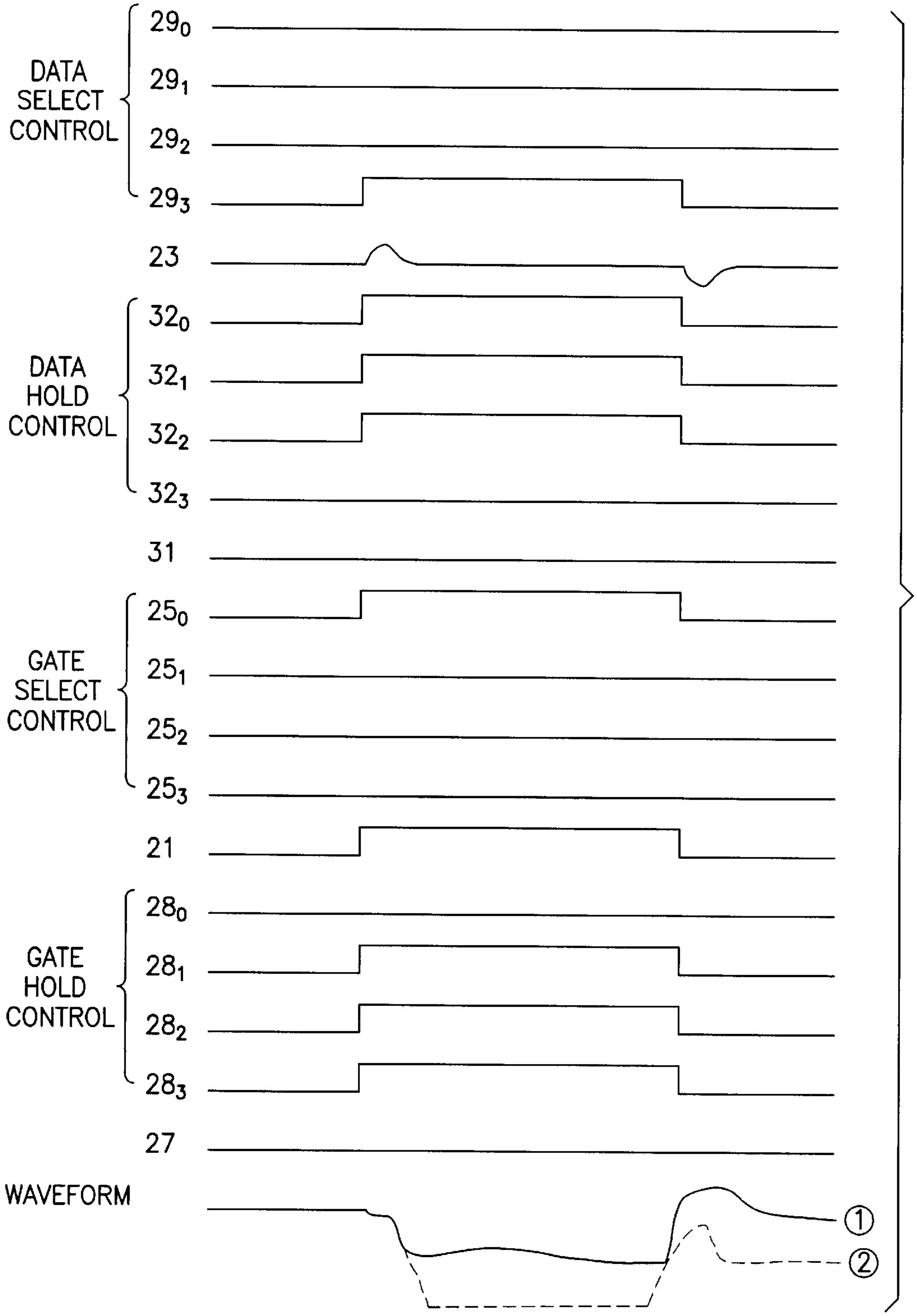
FIG. 5(B) is a timing diagram of an exemplary implementation of the control of FIG. 5(A).

FIGS. 5(A) and (B) illustrate the control of the gate line select/hold circuitry 17 and data line select/hold circuitry 19 in reading charge from a cell connected to an exemplary gate line/data line pair ($GL_0$, $DL_3$) belonging to the group of gate lines and group of data lines illustrated in FIGS. 2 and 3. FIG. 5(A) is a flow chart illustrating the control of the gate line select/hold circuitry 17 and data line select/hold circuitry 19 in reading charge from a cell connected to an exemplary gate line/data line pair ($GL_0$, $DL_3$) in an address cycle; and FIG. 5(B) is a timing diagram of an exemplary implementation of the control of FIG. 5(A). Similar operations are performed in reading charge from multiple cells of the array in an address cycle.

Referring to FIG. 5(A), in step 501, probe pad 27 and probe pad 31 are connected to ground potential. In step 503, hold logic 203 of the gate line select/hold circuitry 17 is controlled (via control signals applied to gate hold control pads 28) such that the other gate lines $GL_1$, $GL_{2,\ GL3}$ of the group are coupled to ground potential via probe pad 27 and the gate line $GL_0$ is not coupled to the probe pad 27. In step 505, hold logic 303 of the data line select/hold circuitry 19 is controlled (via control signals applied to data hold control pad(s) 32) such that such that the other data lines $DL_0$, $DL_1$, $DL_2$ of the group are coupled to ground potential via probe pad 31 and the data line $DL_3$ is not coupled to the probe pad 31. In step 507, select logic 301 of the data line select/hold circuitry 19 is controlled (via control signals applied to data select control pads 29) such that probe pad 23 is coupled to the data line $DL_3$ of the cell. In step 509, select logic 201 of the gate line select/hold circuitry 17 is controlled (via control signals applied to gate select control pads 25) such probe pad 21 is coupled to the gate line $GL_0$ of the cell. In step 511, sense circuitry is coupled to the probe pad 23 (and to the data line $DL_3$ coupled thereto in step 507). In step 513, an activation pulse is applied to pad 21 (and to gate line $GL_0$ coupled thereto in step 509). The activation pulse on gate line $GL_0$ turns the TFT of the cell into a conductive state (ON), thereby providing a conduction path for transferring the charge stored in the cell via the data line $DL_3$ to the sense circuitry coupled thereto in step 511.

Note that in the waveform of FIG. 5(B), the signal denoted "1" illustrates the characteristic signal measured in the event that charge is not stored on the selected cell (i.e., the cell connected to the gate line/data line pair ($GL_0$, $DL_3$)), and the signal denoted "2" illustrates the characteristic signal measured in the event that charge is stored on the selected cell (i.e., the cell connected to the gate line/data line pair ($GL_0$, $DL_3$)).

The test routines described above may identify one (or more) "defective" cells. It may be useful to extend the test routine to determine if the cell is not in fact defective, but a defect exists in the gate line select/hold circuitry 17 and/or in the data line select/hold circuitry 19 associated with the gate line and data line, respectively, connected to the "defective" cell, thereby causing errors in the test routine. For example, an unexpected short circuit or open circuit may exist between two nodes in the gate line select/hold circuitry 17 and/or the data line select/hold circuitry 19 which cause errors in the test routine.

An open circuit in the gate line select/hold circuitry 17 and/or the data line select/hold circuitry 19 is preferably isolated by a performing continuity test between two suspected open nodes whereby a reference test voltage is applied to one of the suspected open nodes and the voltage at the other suspected open node is read. If the voltages do not match, an open circuit may exist between the two nodes; otherwise, an open circuit does not exist between the two nodes. For example, an unexpected open circuit may exist if the select logic 201 and/or hold logic 203 coupled to the gate lines of the group do not switch properly and remain "open". Such an open circuit may be isolated as follows by performing the following for each gate line in the group: i) control select logic 201 such that the probe pad 21 is electrically coupled to the respective gate line; ii) control hold logic 203 such that probe pad 27 is coupled to the respective gate line; and iii) perform a continuity test to determine if an open circuit exists between the probe pads 21 and 27. If an open circuit exists between the probe pads 21 and 27, an open circuit exists in the select logic 201 and/or hold logic 203 for the gate line of the group. Similar operations may be performed to isolate an open circuit in the select logic 301 and/or hold logic 303 coupled to the data lines of the group.

A short circuit in the gate line select/hold circuitry 17 and/or the data line select/hold circuitry 19 is preferably isolated by applying a reference test voltage to a suspected shorted node, measuring the current at the suspected shorted node while selectively placing each other nodes of the circuit in an high impedance state. If a leakage current disappears when a given node is placed into a high impedance state, the short does not exists between the given node and the suspected shorted node. For example, an unexpected short circuit may exist if the hold logic 203 coupled to the gate lines of the group do not switch properly and remain "closed". Such a short circuit may be isolated as follows by performing the following: i) apply a reference test voltage to probe pad 27 and measure current at probe pad 27; ii) cycle through each gate line in the group and control hold logic 203 such that probe pad 27 is coupled to the respective gate line; and iii) for each gate line, if leakage current disappears, the hold logic 203 is operating properly for the respective gate line; otherwise, the hold switch for the respective gate line has an unexpected short circuit. Similar operations may be performed to isolate a short circuit in the select logic 201 coupled to the gate lines for the group and to isolate a short circuit in the select logic 301 and/or hold logic 303 coupled to the data lines of the group.

In the event that a defect is identified in the gate line select/hold circuitry and/or data line select/hold circuitry, the array may be tested manually (or some other test mechanism) to determine if the "defective" cell is in fact defective.

FIG. 1 illustrates an exemplary embodiment of an array tester for performing the test operations of the cells of the array in the manner set forth above. More specifically, the probe pads of the array as described above (probe pads 21,25, 27,28 for each group of gate lines and probe pads 23, 29, 31, and 32 for each group of data lines) are contacted by electrically conductive testing probes extending from a probe fixture 40. A cable 42 has wiring connecting each of the gate line probes (i.e., probes that connect to the probe pads for the groups of gate lines) to gate line drive module 44. A cable 33 has wiring connecting each of the data line probes (i.e., probes that connect to the probe pads for the groups of data lines) to a data line drive/sense module 34. The gate line drive module 44 and data line drive/sense module 34 are controlled by a test controller 46, which executes a control routine that dictates how the test is conducted (such as voltages to be applied, lines to be activated, and analysis of signals read from the cells 12 of the array, the details of which are described above). The test controller 46 interfaces to the gate line drive module 44 via a bus 47, and interfaces to the data line drive/sense module 34 via a bi-directional bus 48. Test controller 46 is connected to a computer system 52 via a bi-directional bus 50. Computer system 52 may be any one of a number of personal computers with suitable software programming support to accomplish the functions described above.

Figure 6:
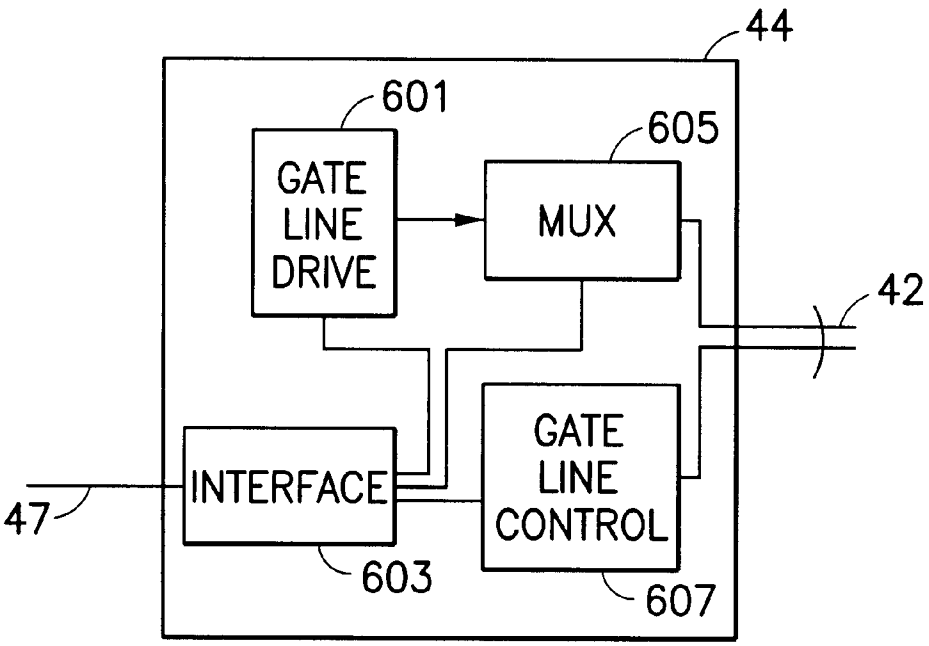
FIG. 6 is a functional block diagram illustrating a preferred embodiment of the gate line drive module of FIG. 1.

FIG. 6 illustrates a preferred embodiment of the gate line drive module 44 of FIG. 1. More specifically, the gate line drive module 44 includes gate line drive circuitry 601, multiplexing circuitry 605 and gate line control circuitry 607 that interface to the test controller 46 via bus 47 and interface logic 603. The gate line drive circuitry 601 generates the gate line activation signals under control of the test controller 46. The gate line multiplexing circuitry 605, under control of the test controller 46, selectively switches the gate line activation signals to the probe pads 21 for the groups of gate lines of the array via the cable 42. Finally, the gate line control circuitry 607, under control of the test controller 46, provides the control signals for controlling the gate line select/hold circuitry 17 for the groups of gate lines of the array via cable 42 and the probe pads 25,27,28 associated with each group of gate lines coupled thereto.

Figure 7:
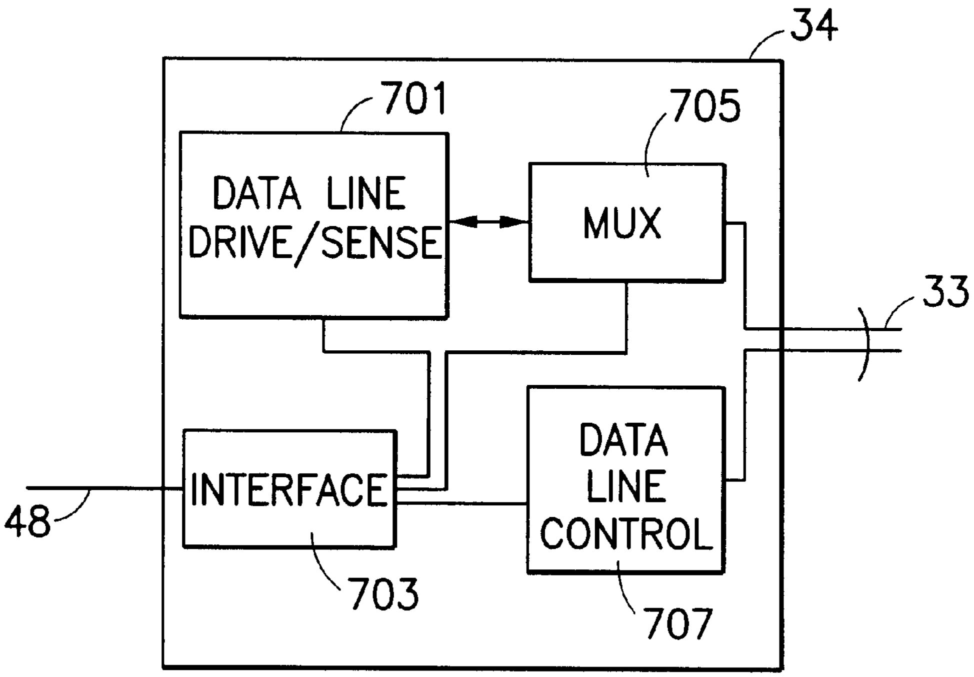
FIG. 7 is a functional block diagram illustrating a preferred embodiment of the data line drive/sense module of FIG. 1.

Similarly, FIG. 7 illustrates a preferred embodiment of the data line drive/sense module 34 of FIG. 1. More specifically, the data line drive/sense module 34 includes data line drive/sense circuitry 701, multiplexing circuitry 705 and data line control circuitry 707 that interface to the test controller 46 via bus 48 and interface logic 703. The data line drive/sense circuitry 701 includes: drive circuitry that, under control of the test controller 46, generates the charging pulse signals for application to the cells of the array via the data lines; and sense circuitry that, under control of the test controller 46, reads the charge transferred from the cells of the array via the data lines, and generates waveforms based upon the transferred charge. The waveform for one or more cells is analyzed by the test controller 46 to identify defective cells (i.e., open gate or data line, short to adjacent line, resistive crossing, etc.) in the array. A more detailed description of the circuitry and operation of the gate line drive module 44 and the data line drive/sense module 34 may be found in U.S. Pat. No. 5,179,345 and 5,546,013, commonly assigned to the assignee of the present invention, herein incorporated by reference in its entirety. The data line multiplexing circuitry 705, under control of the test controller 46, selectively couples the data line drive/sense circuitry 701 to the probe pads 23 for the groups of data lines of the array via the cable 33. Finally, the data line control circuitry 607, under control of the test controller 46, provides the control signals for controlling the data line select/hold circuitry 19 for the groups of data lines of the array via cable 33 and the probe pads 29,31,32 associated with each group of data lines coupled thereto.

Importantly, the present invention provides a flexible interface between the array under test and the test system. More specifically, in the event that the size of the array under test is changed, the gate line select/hold circuitry 17 and/or the data line select/hold circuitry 19 and the probe pads associated therewith may be designed such that they align with the spacing of an existing probe fixture, thereby eliminating the high costs associated with redesigning the probe fixture for the array. In addition, in the event that the resolution of the array under test is changed, the gate line select/hold circuitry 17 and/or the data line select/hold circuitry 19 and the probe pads associated therewith, along with the appropriate updates to the test routine executed by the array tester, can be used to accommodate for the variations in the number of gate lines and/or data lines, thereby eliminating the costs associated with redesigning the probe fixture for the array.

While the invention has been described in connection with specific embodiments, it will be understood that those with skill in the art may develop variations of the disclosed embodiments without departing from the spirit and scope of the following claims.

We claim:

1. An apparatus for testing an array of pixel cells formed on a substrate, wherein each pixel cell is coupled to at least one gate line of a plurality of gate lines formed on the substrate and at least one data line of a plurality of data lines formed on the substrate, CHARACTERIZED IN THAT one of said plurality of gate lines and said plurality of data lines are partitioned into a plurality of groups, the apparatus comprising:

for each particular group, a first probe pad formed on said substrate, and select logic, that is formed on said substrate and coupled between said first probe pad and lines of said particular group, for selectively coupling said first probe pad to said lines of said particular group based upon first control signals supplied to said select logic during a test routine whereby charge is written to, stored, and read from said array of pixel cells.

2. The apparatus of claim 1, further comprising a plurality of first control probe pads that are formed on said substrate for supplying said first control signals to said select logic during said test routine.

3. The apparatus of claim 2, wherein said gate lines are partitioned into said groups.

4. The apparatus of claim 3, further comprising a gate line drive module that operates under control of a test controller; said gate line drive module comprises gate line drive circuitry for generating gate line activation signals, gate line multiplexing circuitry for selectively switching said gate line activation signals to said first probe pad for said groups of gate lines, and gate line control circuitry for generating said first control signals supplied to said select logic for said groups of gate lines via said first control probe pads.

5. The apparatus of claim 2, wherein said data lines are partitioned into said groups.

6. The apparatus of claim 5, further comprising a data line drive/sense module that operates under control of a test controller; said data line drive/sense module comprising drive circuitry for generating charging pulse signals for application to said pixel cells via said data lines, and sense circuitry for reading charge transferred from said pixel cells via said data lines and generating waveforms based upon said transferred charge, data line multiplexing circuitry for selectively coupling said data line/drive sense circuitry to said first probe pad for said groups of data lines, and data line control circuitry for generating said first control signals supplied to said select logic for said groups of data lines via said first control probe pads.

7. The apparatus of claim 2, further comprising:

a second probe pad formed on said substrate; and for each particular group, hold logic, that is formed on said substrate and coupled between said second probe pad and said lines of said particular group, for selectively coupling said second probe pad to said lines of said particular group based upon second control signals supplied to said hold logic during said test routine.

8. The apparatus of claim 7, further comprising a plurality of second control probe pads that are formed on said substrate for supplying said control signals to said hold logic during said test routine.

9. The apparatus of claim 8, wherein said gate lines are partitioned into said groups.

10. The apparatus of claim 9, further comprising a gate line drive module that operates under control of a test controller; said gate line drive module comprises gate line drive circuitry for generating gate line activation signals, gate line multiplexing circuitry for selectively switching said gate line activation signals to said first probe pad for said groups of gate lines, and gate line control circuitry for generating said first control signals supplied to said select logic for said groups of gate lines via said first control probe pads and for generating said second control signals supplied to said hold logic for said groups of gate lines via said second control probe pads.

11. The apparatus of claim 8, wherein said data lines are partitioned into said groups.

12. The apparatus of claim 11, further comprising a data line drive/sense module that operates under control of a test controller; said data line drive/sense module comprising drive circuitry for generating charging pulse signals for application to said pixel cells via said data lines, and sense circuitry for reading charge transferred from said pixel cells via said data lines and generating waveforms based upon said transferred charge, data line multiplexing circuitry for selectively coupling said data line drive/sense circuitry to said first probe pad for said groups of data lines, and data line control circuitry for generating said first control signals supplied to said select logic for said groups of data lines via said first control probe pads and for generating said second control signals supplied to said hold logic for said groups of data lines via said second control probe pads.

13. The apparatus of claim 2, wherein said select logic for a particular group of lines includes at least one switching transistor formed on said substrate for each line within said particular group, wherein conductive path of said switching transistor is coupled between said first probe pad for said particular group and the corresponding fine within said group, and wherein the gate of said switching transistor is coupled to a corresponding first control probe pad.

14. The apparatus of claim 8, wherein said second probe pad and hold logic for said groups of lines and said second control probe pads are removed from said substrate during normal operation if said array of pixel cells.

15. The apparatus of claim 8, wherein said hold logic for a particular group of lines includes at least one switching transistor formed on said substrate for each line within said particular group, wherein conductive path of said switching transistor is coupled between said second probe pad and the corresponding line within said group, and wherein the gate of said switching transistor is coupled to a corresponding second control probe pad.

16. The apparatus of claim 2, wherein said first probe pad and select logic for said groups of lines and said first control probe pads are removed from said substrate during normal operation of said array of pixel cells.

* * * * *

UNITED STATES PATENT AND TRADEMARK OFFICE

CERTIFICATE OF CORRECTION

PATENT NO. : 6,437,596 B1 Page 1 of 1
DATED : August 20, 2002
INVENTOR(S) : Leslie Charles Jenkins, Frank Rober Libsch, Michael Partick Mastro, Robert Wayne Nywening and Robert John Ploastre It is certified that error appears in the above-identified patent and that said Letters Patent is hereby corrected as shown below:

Column 1,
Line 4, before "BACKGROUND OF THE INVENTION", insert
-- The present application claims priority to co-pending U.S. provisional application 60/101,537, filed on September 23, 1998. --

Signed and Sealed this

Thirty-first Day of December, 2002

JAMES E. ROGAN
*Director of the United States Patent and Trademark Office*